(12) United States Patent
Shih et al.

(10) Patent No.: US 6,920,915 B1
(45) Date of Patent: Jul. 26, 2005

(54) APPARATUS AND METHOD FOR COOLING A SEMICONDUCTOR SUBSTRATE

(75) Inventors: Ching-Hsing Shih, Hsin-chu (TW); His-Shen Chuang, Hsin-chu County (TW); Cheng-Fang Chung, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 343 days.

(21) Appl. No.: 09/410,896

(22) Filed: Oct. 2, 1999

(51) Int. Cl.[7] .............................. F28F 7/00; F28F 7/02; C23C 16/458

(52) U.S. Cl. ........................ 165/47; 165/80.4; 165/185; 156/345.52; 156/345.53; 118/724

(58) Field of Search ...................... 165/47, 80.1, 80.2, 165/80.3, 80.4, 185; 156/345, 345.52, 345.53; 118/724, 725, 728; 361/234, 233; 279/128

(56) References Cited

U.S. PATENT DOCUMENTS

| 6,019,164 A | * | 2/2000 | Getchel et al. | 165/185 X |
| 6,032,724 A | * | 3/2000 | Hatta | 165/80.4 X |
| 6,073,681 A | * | 6/2000 | Getchel et al. | 165/185 X |
| 6,081,414 A | * | 6/2000 | Flanigan et al. | 361/234 |
| 6,138,745 A | * | 10/2000 | Moslehi | 165/80.2 |

* cited by examiner

Primary Examiner—Ljiljana Ciric
(74) Attorney, Agent, or Firm—Tung & Associates

(57) ABSTRACT

A cooling stage for a semiconductor substrate and a method for utilizing such cooling stage for cooling of a semiconductor substrate. In the cooling stage, a pedestal that has a substantially planar top surface is equipped with a first plurality of circular grooves concentrically formed in the top surface and a second plurality of linear grooves formed in radial directions emanating from a center of the top surface in fluid communication with the first plurality of circular grooves to allow a cooling fluid to flow therethrough when a semiconductor substrate is positioned on the top surface of the stage.

11 Claims, 2 Drawing Sheets

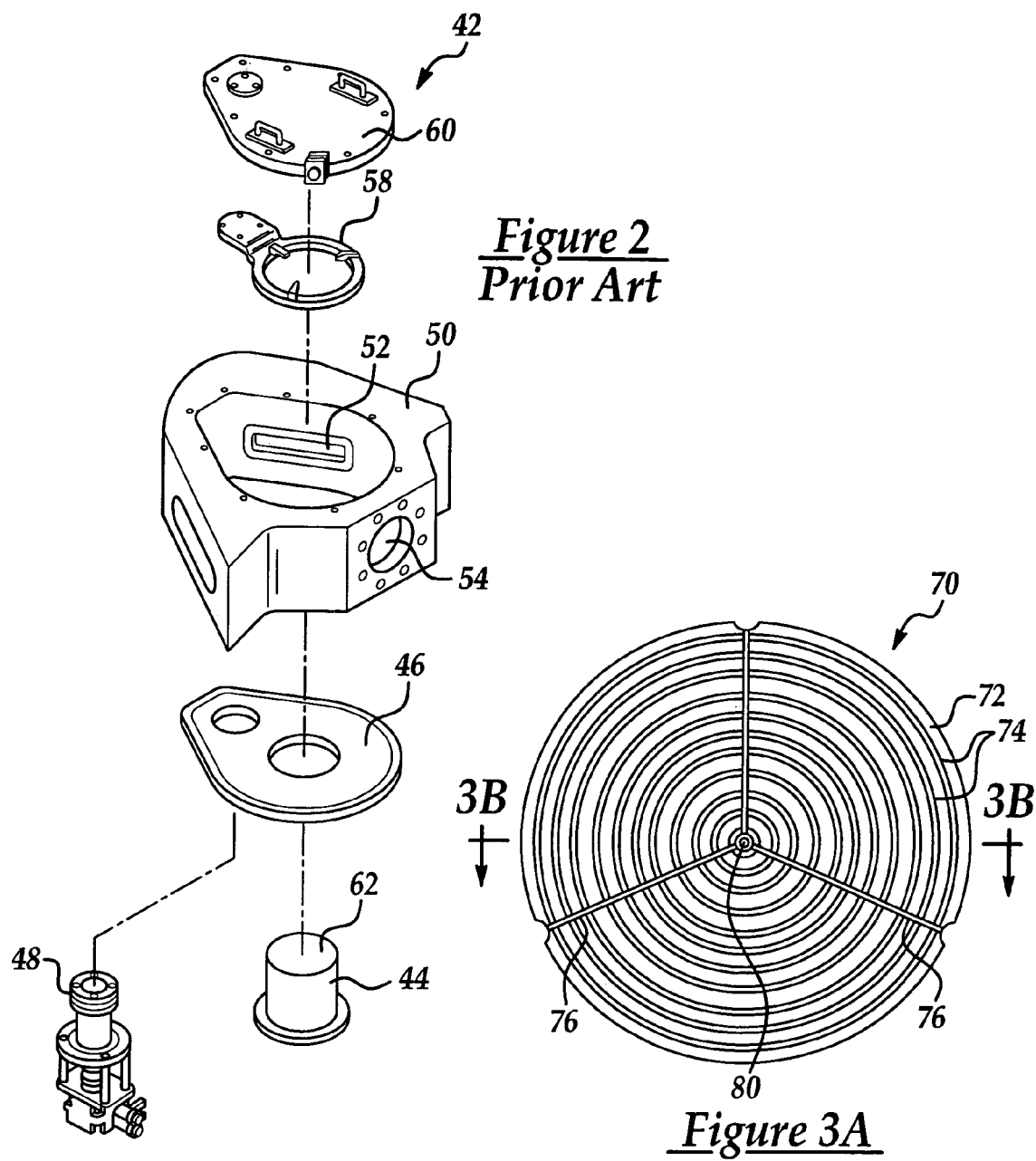
*Figure 2*
*Prior Art*
*Figure 3A*
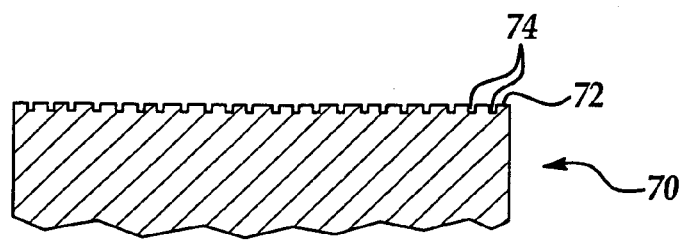
*Figure 3B*

APPARATUS AND METHOD FOR COOLING A SEMICONDUCTOR SUBSTRATE

FIELD OF THE INVENTION

The present invention generally relates to an apparatus and a method for cooling a semiconductor substrate in a process chamber and more particularly, relates to a cooling stage for holding a semiconductor substrate thereon that is provided with a plurality of circular grooves concentrically formed in a top surface of the stage and a plurality of linear grooves formed in radial directions emanating from a center of the top surface in fluid communication with the plurality of circular grooves such that a cooling fluid flows through the grooves to improve cooling of the underside of a substrate placed on the stage and a method for cooling a semiconductor substrate.

BACKGROUND OF THE INVENTION

A frequently used fabrication technique in the manufacture of semiconductor devices involves the deposition of a metallic layer on the surface of a wafer. The deposition process utilizes a thin metal coating to cover steps such as in vias or contact holes that have diameters in the submicron range. The process is essential for achieving precise pattern alignment and reliability in fabricating VLSI (very large scale integration) and ULSI (ultra-large scale integration) devices.

Typically, a wafer surface is etched at a plurality of locations which produces a stepped configuration of spaced lines, trenches, vias and contact holes, i.e., the wafer surface is far from being planar. A key requirement of a deposition process is to uniformly and completely fill the trenches and holes to achieve a generally planar surface. However, the task to completely fill the holes and trenches by using conventional deposition techniques without void formation is very difficult. The presence of voids in a via or contact formed results in poor quality and defective IC devices.

A conventional sputter apparatus that is used to fill trenches or contact holes arranged in a cluster form is shown in FIG. 1. The cluster tool 10 consists of four physical vapor deposition chambers 12, 14, 16 and 18 arranged surrounding a transfer chamber 20. On the other end of the cluster tool 10, a number of auxiliary chambers 22, 24, 26 and 28 are arranged surrounding a buffer chamber 30. Further surrounding and in fluid communication with the buffer chamber 30 are the load lock chambers 36 and 38. The buffer chamber 30 and the transfer chamber 20 are both equipped with a wafer transfer robot 32 which is equipped with a robot blade 34. The cluster tool 10 is mounted in a wafer fabrication facility by through-the-wall installation such that the load lock chambers 36, 38 face the clean room and the process chambers 12~18 are located in a service area. The load lock chambers 36, 38 are used for load and unload wafers into and out of the cluster tool by a machine operator.

Inbetween the buffer chamber 30 and the transfer chamber 20 are positioned two intermediary chambers, i.e., a pre-clean chamber 40 and a cool-down chamber 42. The pre-clean chamber 40 is used for pre-cleaning a wafer before it is delivered to the transfer chamber and subsequently into a sputter chamber. The cool-down chamber 42 is utilized for cooling down a substrate between a high temperature sputter process and a low temperature sputter process.

A detailed, perspective view of the cool-down chamber 42 is shown in FIG. 2. The cool-down chamber 42 may be constructed by a wafer pedestal 44, a chamber base 46, a wafer lifting device 48, a chamber housing 50 which includes a wafer port 52 and a pumping port 54, a wafer lifting ring 58 and a chamber cover 60. As shown in FIG. 2, the wafer lifting device 48 operates through the chamber base 46 on the wafer lifting ring 58 for loading and unloading of a wafer (not shown) onto and off the top surface 62 of the wafer pedestal 44. The wafer is first delivered through the wafer port 52 into the chamber housing 50 by a robot blade. The wafer pedestal 44 is cooled by internal cooling channels (not shown) in which a cooling water is circulated through during the operation of the cool-down chamber 42. When a wafer is positioned on the top surface 62 of the wafer pedestal 44, the bottom surface of the wafer is cooled by heat conductance between the wafer and the wafer pedestal 44 while the top surface of the wafer is cooled by a cooling gas circulated through a cavity in the chamber housing 50. The cooling gas circulated through the cavity is normally an inert gas such as argon, nitrogen or helium.

In the cluster tool 10 shown in FIG. 1, a semiconductor substrate is frequently processed in several sputter chambers during a multi-layer deposition process. For instance, a frequently used sputtering process involves the deposition of an aluminum/copper alloy on a substrate surface followed by the deposition of an anti-reflective coating (ARC) layer on top by a material such as TiN so that the metal layer can be processed in a subsequent photolithographic process. The ARC coating layer is important since it avoids a focusing problem that otherwise result from a reflective surface of the aluminum.

In a typical AlCu/TiN process, the processing temperatures used for the two sputtering processes vary to a large extent. For instance, the AlCu deposition may be conducted at a temperature of about 300° C., while the TiN sputtering process may be conducted at a temperature below 200° C. A rapid cool-down process must therefore be conducted to reduce the temperature of the substrate between the two processes. In the operation of the cool-down chamber 42, it has been noticed that the cooling of the bottom side of a substrate is inefficient using a conventional pedestal even though an intimate contact is established between a smooth wafer surface and a smooth pedestal surface. The cooling efficiency by heat conductance to the cooling fluid flown through the wafer pedestal does not approach that of the cooling fluid flown through the chamber cavity for cooling the top surface of the wafer. Due to a significant difference existed between the cooling rates on the top surface and on the bottom surface of the wafer, thermal stresses produced by the temperature difference are also significantly different in the top surface and in the bottom surface of the wafer. Since wafers are very thin, a large difference in the thermal stresses existed between the two surfaces frequently cause a vertical movement of the wafer from the pedestal surface, i.e., the wafer jumps up from the pedestal surface to at least 1 cm. Whenever the wafer jump occurs, the position of the wafer is changed on the pedestal and thus the loading of the wafer by the wafer lifting ring 58 is dislocated. This results in an inaccurate placement of the wafer or more seriously, the dropping of the wafer from the lifting ring resulting in a total loss of the wafer.

Furthermore, the intimate contact between two smooth surfaces of the wafer and the wafer pedestal frequently results in a suction force between the two surfaces. The suction force prevents the wafer from being picked up by the wafer lifting ring 58 and thus cause further processing difficulties.

It is therefore an object of the present invention to provide a wafer pedestal for cooling a semiconductor substrate positioned thereon that does not have the drawbacks or shortcomings of the conventional wafer pedestals.

It is another object of the present invention to provide a cooling stage for a semiconductor substrate that can be effectively used as a wafer pedestal for improved cooling of a semiconductor substrate.

It is a further object of the present invention to provide a cooling stage for a semiconductor substrate that can be used effectively in cooling a semiconductor substrate without the occurrence of the wafer jump phenomenon.

It is another further object of the present invention to provide a cooling stage for a semiconductor substrate that can be used efficiently for cooling a substrate without creating a suction force between the substrate and the cooling stage.

It is still another object of the present invention to provide a cooling stage for a semiconductor substrate that utilizes a wafer pedestal provided with a grooved surface for achieving improved cooling of the wafer.

It is yet another object of the present invention to provide a cooling stage for a semiconductor substrate wherein a pedestal is equipped with a plurality of circular grooves concentrically formed in a top surface and a plurality of linear grooves formed in radial directions emanating from a center of the top surface.

It is still another further object of the present invention to provide a method for cooling a semiconductor substrate by first providing a cooling stage that includes a wafer pedestal equipped with a grooved top surface, then flowing a cooling gas through the grooves to carry away heat from a backside of a semiconductor substrate positioned on the stage.

It is yet another further object of the present invention to provide a wafer pedestal that is effective in cooling a high temperature processed wafer that includes a pedestal that has a grooved surface including at least five circular grooves concentrically formed in the top surface and three linear grooves formed in radial directions emanating from a center of the top surface.

SUMMARY OF THE INVENTION

In accordance with the present invention, a cooling stage for a semiconductor substrate and a method for using such cooling stage for the effective cooling of a heated substrate are provided.

In a preferred embodiment, a cooling stage for a semiconductor substrate is provided which includes a pedestal that has a substantially planar top surface, a first plurality of circular grooves concentrically formed in the top surface, and a second plurality of linear grooves formed in radial directions emanating from a center of the top surface in fluid communication with the first plurality of circular grooves allowing a cooling fluid to flow therethrough when the semiconductor substrate is positioned on the top surface of the pedestal.

In the cooling stage for a semiconductor substrate, the first plurality may be at least three and the second plurality may be at least two, or the first plurality may be preferably five and the second plurality may be preferably three. The first plurality of circular grooves and the second plurality of linear grooves each may have a width between about 1 mm and about 7 mm, and a depth between about 1 mm and about 7 mm, or each may have a width preferably between about 3 mm and about 5 mm, and a depth preferably between about 1 mm and about 3 mm. The cooling stage may be situated in a cool-down chamber in a cluster tool for sputtering of metals on semiconductor wafers. The cooling stage may be used in a cool-down chamber between a high temperature sputtering process and a low temperature sputtering process for cooling down a substrate or a wafer.

The present invention is further directed to a method for cooling a semiconductor substrate that includes the steps of providing a cooling stage that includes a wafer pedestal equipped with a grooved top surface thereon, the grooved top surface includes a first plurality of circular grooves concentrically formed in the top surface and a second plurality of linear grooves formed in radial directions emanating from the center of the top surface in fluid communication with the first plurality of circular grooves, positioning a heated semiconductor substrate on the grooved top surface, flowing a cooling liquid through a cooling channel in the wafer pedestal to carry away heat transferred to the grooved top surface, and flowing a cooling gas through the first and second plurality of circular grooves to carry away heat from a backside of the heated semiconductor substrate.

In the method for cooling a semiconductor substrate, the grooved top surface may further include two linear grooves, and preferably at least five circular grooves and at least three linear grooves. The method may further include the step of providing the grooved top surface with a plurality of circular and linear grooves each having a width between about 1 mm and about 7 mm, and a depth between about 1 mm and about 7 mm, and preferably a width between about 3 mm and about 5 mm, and a depth between about 1 mm and about 3 mm. The method may further include the step of positioning a semiconductor substrate that exits from a high temperature sputtering chamber on the grooved top surface of the cooling stage. The method may further include the step of removing a cooled-down semiconductor substrate from the cooling stage and positioning the substrate in a low temperature sputtering chamber.

The method may further include the steps of flowing a cooling liquid of cooling water through a cooling channel in the wafer pedestal, and flowing a cooling gas of an inert gas through the first and second plurality of circular and linear grooves.

In another preferred embodiment, a wafer pedestal that is effective in cooling a high temperature processed wafer is provided which includes a wafer pedestal that has a substantially planar top surface, at least three circular grooves concentrically formed in the top surface, and at least two linear grooves formed in radial directions emanating from a center of the top surface in fluid communication with the at least three circular grooves such that a cooling fluid flows through the circular and the linear grooves to cool a wafer positioned thereon.

In the wafer pedestal that is effective in cooling a high temperature processed wafer, the wafer pedestal is positioned in a cooled-down chamber between a high temperature sputtering chamber and a low temperature sputtering chamber. The wafer pedestal preferably includes at least five circular grooves and at least three linear grooves provided in a top surface of the pedestal. The wafer pedestal may further include nine circular grooves and three linear grooves each having a width of about 2 mm and a depth of about 1 mm. The cooling fluid flowing through the circular and the linear grooves is an inert gas selected from the group consisting of argon, nitrogen and helium.

BRIEF DESCRIPTION OF THE DRAWINGS

These and other objects, features and advantages of the present invention will become apparent from the following detailed description and the appended drawings in which:

FIG. 2 is a perspective view of the major components used in a cool-down chamber including a wafer pedestal having a smooth top surface.

FIG. 3A is a plane view of the present invention wafer pedestal showing the plurality of circular grooves and the plurality of linear grooves.

FIG. 3B is a cross-sectional view of the present invention wafer pedestal showing the depth of the circular grooves.

DETAILED DESCRIPTION OF THE PREFERRED EMBODIMENT

Figure 1:
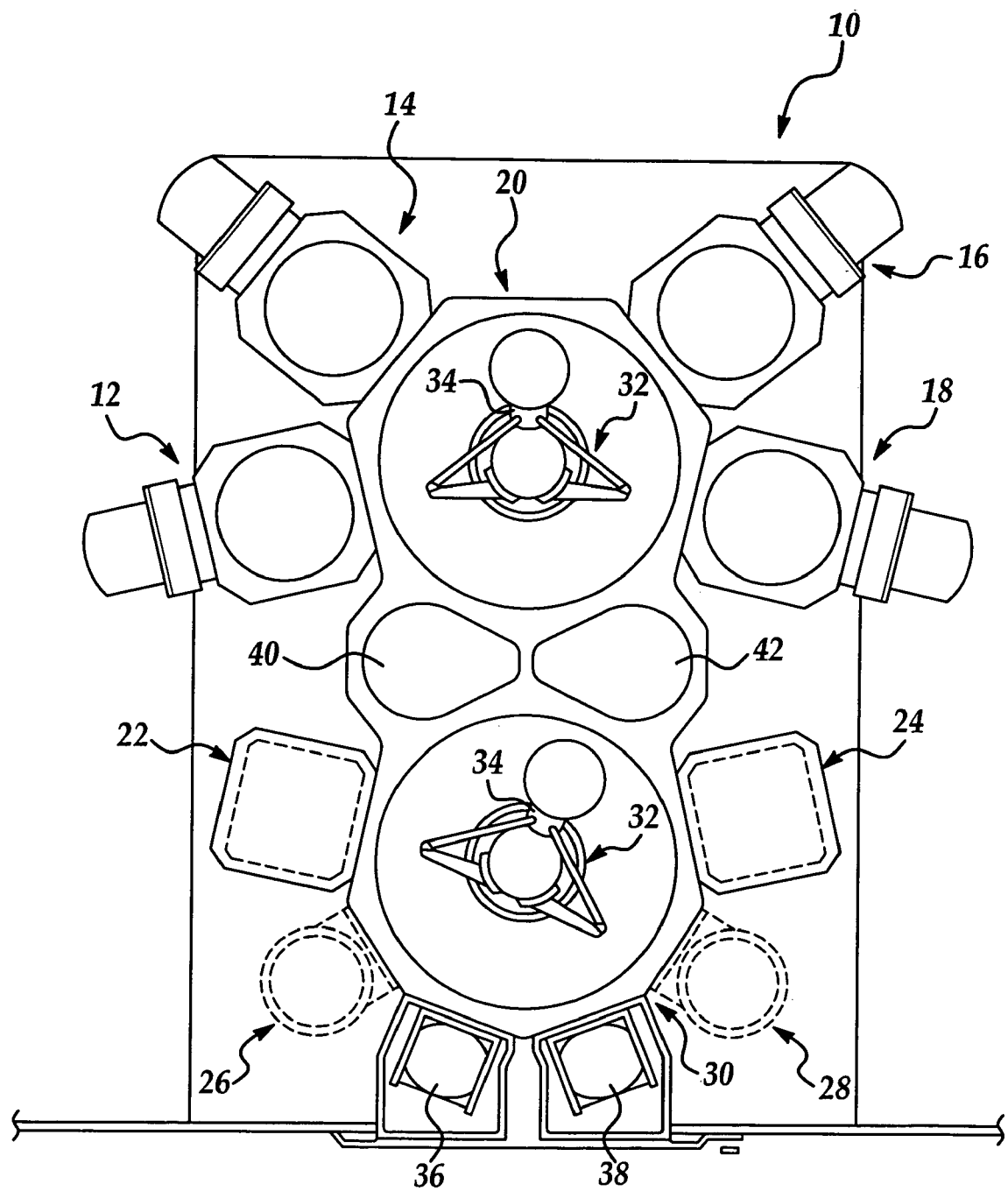
FIG. 1 is a plane view illustrating a conventional cluster tool for conducting a sputtering process utilizing a cool-down chamber.

The present invention discloses a cooling stage for use in cooling a semiconductor substrate and a method for utilizing such cooling stage for improved cooling of a substrate such that an imbalance of thermal stresses between a top surface and a bottom surface can be avoided.

In the present invention novel cooling stage, a substrate pedestal is provided which has a substantially planar top surface, a first plurality of circular grooves concentrically formed in the top surface, and a second plurality of linear grooves formed in radial directions emanating from the center of the top surface in fluid communication with the first plurality of circular grooves to allow a cooling fluid to flow therethrough when a semiconductor substrate is positioned on top of the pedestal.

In the novel cooling stage, the first plurality of circular grooves provided is at least three, and preferably at least five, while the second plurality of grooves provided is at least two, and preferably at least three. The dimensions of the grooves provided may be a width between about 1 mm and about 7 mm, and a depth between about 1 mm and about 7 mm, preferably a width between about 3 mm and about 5 mm, and a depth between about 1 mm and about 3 mm. The novel cooling stage may be advantageously situated in a cool-down chamber as part of a cluster tool for sputtering metal on a semiconductor wafer. The cooling stage may be advantageously used between a high temperature sputtering process and a low temperature sputtering process for the rapid and uniform cooling of a wafer from a high process temperature, i.e., 300° C., which is frequently encountered in the sputtering of an aluminum/copper alloy.

The present invention further discloses a method for cooling a semiconductor wafer which can be carried out by the operating steps of first providing a cooling stage that has a wafer pedestal equipped with a grooved top surface including circular grooves and linear grooves radiating from a center of the surface, then flowing a cooling liquid through a cooling channel in the wafer pedestal to carry away heat transferred from the wafer to the grooved top surface when a heated wafer is positioned on the surface, and then flowing a cooling fluid such as an inert gas of argon through the second plurality of circular and linear grooves to carry away heat from a backside of the wafer.

Referring now to FIG. 3B, wherein a present invention cooling stage (or wafer pedestal) 70 is shown in a plane view. As stated previously, the top surface 72 of the cooling stage 70 is provided with a plurality of circular grooves 74 and a plurality of linear grooves 36. The circular grooves 74 are concentrically formed on the surface 72 in a suitable number such as at least three. A preferred number is at least five grooves, while 11 grooves are shown in FIG. 3A for a cooling stage 70 used for a 300 mm diameter wafer. The linear grooves 76 are provided in radial directions emanating from a center 80 of the top surface 72 intersecting the circular grooves 74 and forming a fluid communication thereinbetween. The width and the depth for the circular grooves 74 and the linear grooves 76 are normally the same. For instance, a suitable width for the grooves may be between about 1 mm and about 7 mm, preferably between about 3 mm and about 5 mm. A suitable depth of the grooves may be between about 1 mm and about 7 mm, and preferably between about 1 mm and about 3 mm. In the grooves 74 shown in FIG. 3B, the width and the depth of the grooves are approximately the same, i.e., at about 2 mm. The width and depth of the grooves may be suitably selected depending on the total area of the cooling stage and the characteristics of the substrate surface to be cooled. It is therefore recognized that, the dimensions shown in FIG. 3B is merely used for illustration purpose, any other suitable dimensions may be utilized equally advantageously in the present invention apparatus and method.

The present invention novel apparatus of the cooling stage equipped with cooling channels or grooves on a top surface provides a multiplicity of benefits. For instance, the novel apparatus completely eliminates the wafer jump defect observed during cooling of a hot wafer on a smooth surfaced stage. Secondly, the present invention novel apparatus effectively prevents wafer from being sucked on the cooling stage due to a vacuum effect when a wafer is placed on a smooth surfaced cooling stage. The cooling grooves effectively prevent wafer from adhering to the cooling stage and thus avoid unnecessary mechanical stresses on the wafer. Thirdly, the present invention novel cooling stage effectively prevents wafer from sliding on a cooling stage due to an air cushion effect which otherwise causes a dislocation of the wafer on the cooling stage. The present invention novel apparatus and method uniformly cools a wafer (or a semiconductor substrate) on both its top surface and its bottom surface such that an imbalance in thermal stresses can be avoided to avoid a dislocation of the wafer on the cooling stage.

The present invention novel apparatus and method has therefore been amply described in the above descriptions and in the appended drawings of FIGS. 3A and 3B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A cooling stage for a semiconductor substrate comprising:
   a pedestal having a substantially planar top surface,
   a first plurality of circular grooves concentrically formed in said top surface, and
   a second plurality of linear grooves formed in radial directions emanating from a center of said top surface in fluid communication with each and every one of said first plurality of circular grooves allowing a cooling fluid to flow therethrough when said semiconductor substrate is positioned on said top surface of the pedestal, said first plurality of circular grooves and said second plurality of linear grooves each having a width between about 1 mm and about 7 mm, and a depth between about 1 mm and about 7 mm.

2. A cooling stage for a semiconductor substrate according to claim 1, wherein said first plurality is at least three and said second plurality is at least two.

3. A cooling stage for a semiconductor substrate according to claim 1, wherein said first plurality is at least five and said second plurality is at least three.

4. A cooling stage for a semiconductor substrate according to claim 1, wherein said first plurality of circular grooves and said second plurality of linear grooves each having a width between about 3 mm and about 5 mm, and a depth between about 1 mm and about 3 mm.

5. A method for cooling a semiconductor substrate comprising the steps of:
 providing a cooling stage comprising a wafer pedestal equipped with a grooved top surface thereon, said grooved top surface comprises a first plurality of circular grooves concentrically formed in said top surface and a second plurality of linear grooves formed in radial directions emanating from a center of said top surface in fluid communication with each and every one of said first plurality of circular grooves, said first plurality of circular grooves and said second plurality of linear grooves each having a width between about 1 mm and about 7 mm, and a depth between about 1 mm and about 7 mm,
 positioning a heated semiconductor substrate on said grooved top surface,
 flowing a cooling liquid through a cooling channel in said wafer pedestal to carry away heat transferred to said grooved top surface, and
 flowing a cooling gas through said first and second plurality of circular and linear grooves to carry away heat from a backside of said heated semiconductor substrate.

6. A method for cooling a semiconductor substrate according to claim 5, wherein said first plurality of circular grooves comprises at least three circular grooves and said second plurality of linear grooves comprises at least two linear grooves.

7. A method for cooling a semiconductor substrate according to claim 5, wherein said first plurality of circular grooves comprises at least five circular grooves and said second plurality of linear grooves comprises at least three linear grooves.

8. A method for cooling a semiconductor substrate according to claim 5 further comprising the step of positioning a semiconductor substrate exiting a high temperature sputtering chamber on said grooved top surface of said cooling stage.

9. A method for cooling a semiconductor substrate according to claim 5 further comprising the step of removing a cooled-down semiconductor substrate from said cooling stage and positioning the substrate in a low temperature sputter chamber.

10. A method for cooling a semiconductor substrate according to claim 5 further comprising the steps of flowing a cooling liquid through said cooling channel in said wafer pedestal, and flowing a cooling gas of an inert gas through said first and second plurality of circular and linear grooves.

11. A wafer pedestal effective for cooling a high temperature processed wafer comprising:
 a wafer pedestal having a substantially planar top surface,
 nine circular grooves concentrically formed in said planar top surface, said three linear grooves formed in radial directions emanating from a center of said planar top surface and in fluid communication with each and every one of said nine circular grooves for flowing a cooling fluid therethrough to cool the high temperature processed wafer positioned thereon, said three linear grooves each having a width of about 2 mm and a depth of about 1 mm.

\* \* \* \* \*